United States Patent
Boucard et al.

(10) Patent No.: US 9,396,130 B2
(45) Date of Patent: Jul. 19, 2016

(54) SYSTEM TRANSLATION LOOK-ASIDE BUFFER INTEGRATED IN AN INTERCONNECT

(71) Applicant: QUALCOMM TECHNOLOGIES, INC., San Diego, CA (US)

(72) Inventors: Philippe Boucard, Le Chesnay (FR); Jean-Jacques LeCler, Sunnyvale, CA (US); Laurent Moll, San Jose, CA (US)

(73) Assignee: Qualcomm Technologies, Inc., San Diego, CA (US)

( * ) Notice: Subject to any disclaimer, the term of this patent is extended or adjusted under 35 U.S.C. 154(b) by 351 days.

(21) Appl. No.: 13/969,451

(22) Filed: Aug. 16, 2013

(65) Prior Publication Data
US 2014/0052919 A1    Feb. 20, 2014

Related U.S. Application Data

(60) Provisional application No. 61/684,705, filed on Aug. 18, 2012.

(51) Int. Cl.
*G06F 12/08* (2016.01)
*G06F 12/10* (2016.01)
(Continued)

(52) U.S. Cl.
CPC ........ *G06F 12/1036* (2013.01); *G06F 12/0207* (2013.01); *G06F 12/0215* (2013.01); *G06F 12/0811* (2013.01); *G06F 12/1027* (2013.01); *G06F 12/1081* (2013.01); *G06F 17/5009* (2013.01); *G06F 2212/681* (2013.01)

(58) Field of Classification Search
CPC ............ G06F 12/0207; G06F 12/0215; G06F 12/0811; G06F 12/1027; G06F 12/1081; G06F 17/5009
USPC .................................................. 711/122, 206
See application file for complete search history.

(56) References Cited

U.S. PATENT DOCUMENTS

| | | |
|---|---|---|
| 4,525,780 A | 6/1985 | Bratt et al. |
| 4,914,577 A | 4/1990 | Stewart et al. |
| 5,598,553 A | 1/1997 | Richter et al. |

(Continued)

FOREIGN PATENT DOCUMENTS

| | | |
|---|---|---|
| EP | 0518575 A1 | 12/1990 |
| EP | 0495167 A2 | 7/1992 |

(Continued)

OTHER PUBLICATIONS

Altera, "SOPC Builder User Guide", Dec. 2010, chapter 11, pp. 1-25. [retrieved May 14, 2014]. Retrieved rom the Internet:.

(Continued)

*Primary Examiner* — Yong Choe
(74) *Attorney, Agent, or Firm* — Muncy, Geissler, Olds & Lowe, P.C.

(57) ABSTRACT

System TLBs are integrated within an interconnect, use a and share a transport network to connect to a shared walker port. Transactions are able to pass STLB allocation information through a second initiator side interconnect, in a way that interconnects can be cascaded, so as to allow initiators to control a shared STLB within the first interconnect. Within the first interconnect, multiple STLBs share an intermediate-level translation cache that improves performance when there is locality between requests to the two STLBs.

23 Claims, 5 Drawing Sheets

(51) Int. Cl.
*G06F 17/50* (2006.01)
*G06F 12/02* (2006.01)

(56) References Cited

U.S. PATENT DOCUMENTS

| | | | |
|---|---|---|---|
| 5,694,567 A * | 12/1997 | Bourekas | G06F 12/0864 711/202 |
| 5,701,448 A | 12/1997 | White | |
| 5,752,274 A | 5/1998 | Garibay, Jr. et al. | |
| 6,065,113 A | 5/2000 | Shiell et al. | |
| 6,195,735 B1 | 2/2001 | Krueger et al. | |
| 6,212,603 B1 | 4/2001 | McInerney et al. | |
| 6,289,138 B1 | 9/2001 | Yip et al. | |
| 6,389,514 B1 | 5/2002 | Rokicki | |
| 6,560,664 B1 * | 5/2003 | Carlson | G06F 12/10 710/113 |
| 6,574,698 B1 | 6/2003 | Dhong et al. | |
| 6,629,207 B1 | 9/2003 | Yoshioka et al. | |
| 6,675,280 B2 | 1/2004 | Cooksey et al. | |
| 6,735,688 B1 * | 5/2004 | Upton | G06F 9/3838 712/218 |
| 6,819,326 B2 | 11/2004 | Jaspers | |
| 7,099,318 B2 | 8/2006 | Harriman | |
| 7,143,225 B1 * | 11/2006 | Tischler | G06F 13/4234 710/305 |
| 7,797,494 B2 | 9/2010 | Kimura | |
| 7,962,715 B2 | 6/2011 | Ware | |
| 8,095,931 B1 | 1/2012 | Chen et al. | |
| 8,185,696 B2 | 5/2012 | Vuletic et al. | |
| 8,225,070 B2 | 7/2012 | Okawara et al. | |
| 8,250,307 B2 | 8/2012 | Arimilli et al. | |
| 8,447,837 B2 | 5/2013 | Devanneaux et al. | |
| 2002/0038401 A1 | 3/2002 | Zaidi et al. | |
| 2003/0033510 A1 * | 2/2003 | Dice | G06F 9/383 712/235 |
| 2003/0105940 A1 | 6/2003 | Cooksey et al. | |
| 2003/0126371 A1 | 7/2003 | Venkatraman | |
| 2003/0135685 A1 * | 7/2003 | Cowan | G06F 13/4027 710/308 |
| 2004/0034718 A1 | 2/2004 | Goldenberg et al. | |
| 2004/0176942 A1 | 9/2004 | Chochia et al. | |
| 2004/0215649 A1 | 10/2004 | Whalen et al. | |
| 2004/0215849 A1 | 10/2004 | Graham et al. | |
| 2004/0260909 A1 | 12/2004 | Lee et al. | |
| 2005/0108497 A1 * | 5/2005 | Bridges | G06F 9/342 711/207 |
| 2005/0160250 A1 * | 7/2005 | Yoshimi | G06F 1/3225 711/207 |
| 2006/0149981 A1 * | 7/2006 | Dieffenderfer | G06F 9/30054 713/320 |
| 2006/0179175 A1 | 8/2006 | Bockhaus et al. | |
| 2006/0184804 A1 * | 8/2006 | Varma | G06F 12/0897 713/193 |
| 2007/0044106 A2 | 2/2007 | Kissell et al. | |
| 2007/0067505 A1 | 3/2007 | Kaniyur et al. | |
| 2007/0092018 A1 | 4/2007 | Fonseka et al. | |
| 2008/0028181 A1 * | 1/2008 | Tong | G06F 3/14 711/207 |
| 2008/0040584 A1 | 2/2008 | Hansen et al. | |
| 2008/0209130 A1 * | 8/2008 | Kegel | G06F 12/1027 711/135 |
| 2008/0209173 A1 | 8/2008 | Evers et al. | |
| 2009/0019252 A1 | 1/2009 | Burns et al. | |
| 2009/0164998 A1 | 6/2009 | Stevens et al. | |
| 2009/0235278 A1 | 9/2009 | Prakash | |
| 2010/0037028 A1 * | 2/2010 | Shen | G06F 12/1027 711/154 |
| 2010/0057997 A1 | 3/2010 | Moyer | |
| 2010/0070708 A1 | 3/2010 | Maruyama | |
| 2010/0100682 A1 | 4/2010 | Guthrie et al. | |
| 2010/0153686 A1 | 6/2010 | Frank | |
| 2010/0223505 A1 | 9/2010 | Andreev et al. | |
| 2010/0262787 A1 | 10/2010 | Arimilli et al. | |
| 2010/0306503 A1 | 12/2010 | Henry et al. | |
| 2010/0318707 A1 | 12/2010 | Tanaka et al. | |
| 2011/0010521 A1 | 1/2011 | Wang et al. | |
| 2011/0040941 A1 | 2/2011 | Diefendorff | |
| 2011/0072235 A1 | 3/2011 | Deming et al. | |
| 2011/0074802 A1 | 3/2011 | Nickolls et al. | |
| 2011/0145542 A1 | 6/2011 | Morrow | |
| 2011/0219208 A1 | 9/2011 | Asaad et al. | |
| 2012/0011342 A1 | 1/2012 | Ingle et al. | |
| 2012/0066455 A1 | 3/2012 | Punyamurtula et al. | |
| 2012/0117301 A1 * | 5/2012 | Wingard | G06F 12/1027 711/6 |
| 2012/0124260 A1 | 5/2012 | Kothamasu | |
| 2013/0227245 A1 | 8/2013 | Gupta et al. | |
| 2013/0346703 A1 | 12/2013 | McCauley et al. | |
| 2014/0052954 A1 | 2/2014 | Moll et al. | |
| 2014/0052955 A1 | 2/2014 | Moll et al. | |
| 2014/0052956 A1 | 2/2014 | Moll | |

FOREIGN PATENT DOCUMENTS

| | | |
|---|---|---|
| EP | 1031919 B1 | 10/2008 |
| WO | 2007079192 A2 | 7/2007 |

OTHER PUBLICATIONS

International Search Report and Written Opinion—PCT/US2013/055451—ISA/EPO—May 23, 2014.

* cited by examiner

SYSTEM TRANSLATION LOOK-ASIDE BUFFER INTEGRATED IN AN INTERCONNECT

CROSS-REFERENCE AND RELATED APPLICATIONS

This application claims priority under 35 USC 119 from U.S. Provisional Application Ser. No. 61/684705 filed on Aug. 18, 2012, titled SYSTEM TRANSLATION LOOK-ASIDE BUFFER WITH REQUEST-BASED ALLOCATION AND PREFETCHING, the entire disclosure of which is incorporated herein by reference.

FIELD OF THE INVENTION

The invention disclosed herein is in the field of computer system design, particularly for system-on-chip semiconductor devices.

BACKGROUND

Memory Management Units (MMUs) are commonly used in microprocessors to provide virtual memory capability. When virtual memory is enabled, software executing on the processor only sees and uses Virtual Addresses (VA). The MMU is tasked to convert a VA into a Physical Address (PA) that can then be used inside and outside the processor. Using virtual memory has a number of advantages including being able to give the illusion of more memory than is actually available, giving access to a physical memory system that has more address bits than are supported by the software, and protection of the physical memory with varying access rights.

Some modern systems that support virtualization have two levels of translation between VAs and PAs. The first level is similar to that found on non-virtualized system, but the PA is not the final PA. It may be called Intermediate Physical Address (IPA) or Guest Physical Address (GPA). The second level maps that intermediate address into a final PA. In these systems, for any software running on the processor, the first level or the second level or both may be enabled.

In general, the virtual address space is divided into pages. Pages are commonly a few kilobytes, though other page sizes can be used. Systems often support multiple page sizes from a few kilobytes to a few megabytes or even gigabytes to increase translation efficiency. All addresses within a page are translated in the same fashion and all the access right information is the same. The translation between VAs and PAs is done through a (often multi-level) page table. The process of going through the page table to translate a VA into a PA is often called walking as it comprises a sequence of table lookups.

The MMU often comprises two parts. The first part is called the Translation Look-aside Buffer (TLB). It caches translations so that they are very quickly accessible to the processor, so that for translations that are cached, the processor can execute with little delay. The second part is the walker, which walks the page tables when the TLB does not contain a translation. In some systems, there may be more caching between the TLB and the walker. For instance, the TLB may have 2 levels of caching. The walker may itself contain a cache.

A System MMU (SMMU) mirrors the use of the MMU, but applied to I/O devices instead of microprocessors. With an SMMU, I/O devices can also take advantage of the benefits of virtual memory and virtualization. Like an MMU, an SMMU operates on pages and uses page tables to calculate translations. In some cases, an SMMU may use the same page table formats as the MMU of a processor to which the SMMU's I/O device is connected. In that case, the page tables may be shared between the MMU and the SMMU.

Like an MMU, an SMMU often consists of a walker and a System TLB (STLB), acting as a cache for translations to help in keeping peak performance of I/O device. In some cases, multiple STLBs can share a single walker for efficiency reasons.

In most cases, TLBs inside processors are tightly integrated with the processor because physical addresses are needed inside the processor (e.g. for caches that may be visible to cache coherency). In contrast, an STLB does not have to be integrated inside an I/O device. It may be placed outside the I/O device without any negative impact. In many cases, multiple I/O devices may share a single STLB. An STLB just needs to be between the source and the destination of a request to provide translation services. In designs that have an interconnect, STLBs may be placed between the I/O devices and the interconnect or within the interconnect.

Each STLB has a target side interface that makes memory requests using a protocol. Different I/O devices require different protocols. This makes the design of different STLBs inconsistent and therefore more complex. Address decoding is performed in the STLB and in the interconnect, including unnecessarily redundant logic, which uses silicon area and limits operating speed. The interface protocol to transport requests from STLBs to their walkers are different from the protocol used to transport requests from initiators to targets within the interconnect. This increases the complexity of verification and system level modeling. Furthermore, when using subsystem interconnects to integrate separately designed logic blocks, there is no way to transfer translation information and translation prefetch requests from initiators to TLBs through an interconnect. Further still, multiple STLBs, accessing shared translations, have no benefit from the shared locality of their requests.

SUMMARY OF THE INVENTION

The disclosed invention is an improved STLB and system comprising such. The STLB is placed in the interconnect, close to the I/O devices. It uses a generic interface on the initiator side and target side so as to be reusable between I/O devices of different interface protocols. It is connected to a shared walker using a transport protocol that is universal with the data path transport topology.

The disclosed invention allows translation allocation information and translation prefetch commands to pass through the interconnect from initiators to SLTBs located on the target side of the interconnect. Furthermore, multiples STLBs can use a shared intermediate-level translation cache to take advantage of locality of requests between different I/O devices.

DETAILED DESCRIPTION

Figure 1:
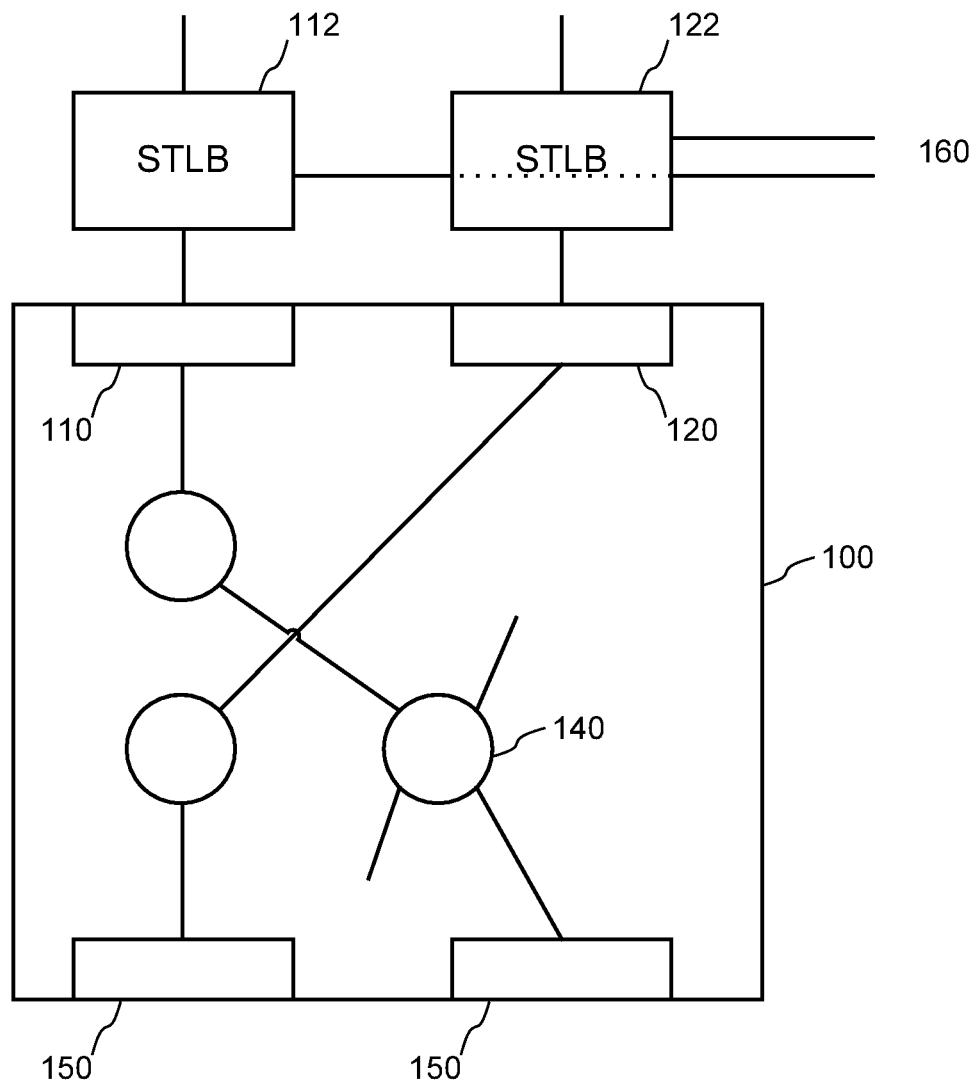
FIG. 1 illustrates a conventional system of system TLBs and an interconnect in accordance with the present invention.

An interconnect 100 with STLBs is shown in FIG. 1. The interconnect 100 comprises initiator network interface unit ports 110 and 120, a central interconnection network 140, and target ports 150. Initiator network interface port 110 uses the AXI protocol and initiator network interface port 120 uses the AHB interface protocol. Initiator IP interfaces are connected to initiator network interface ports 110 and 120 through STLBs 112 and 122 respectively. STLBs 112 and 122 are connected to a walker through walker interface port 160.

Figure 2:
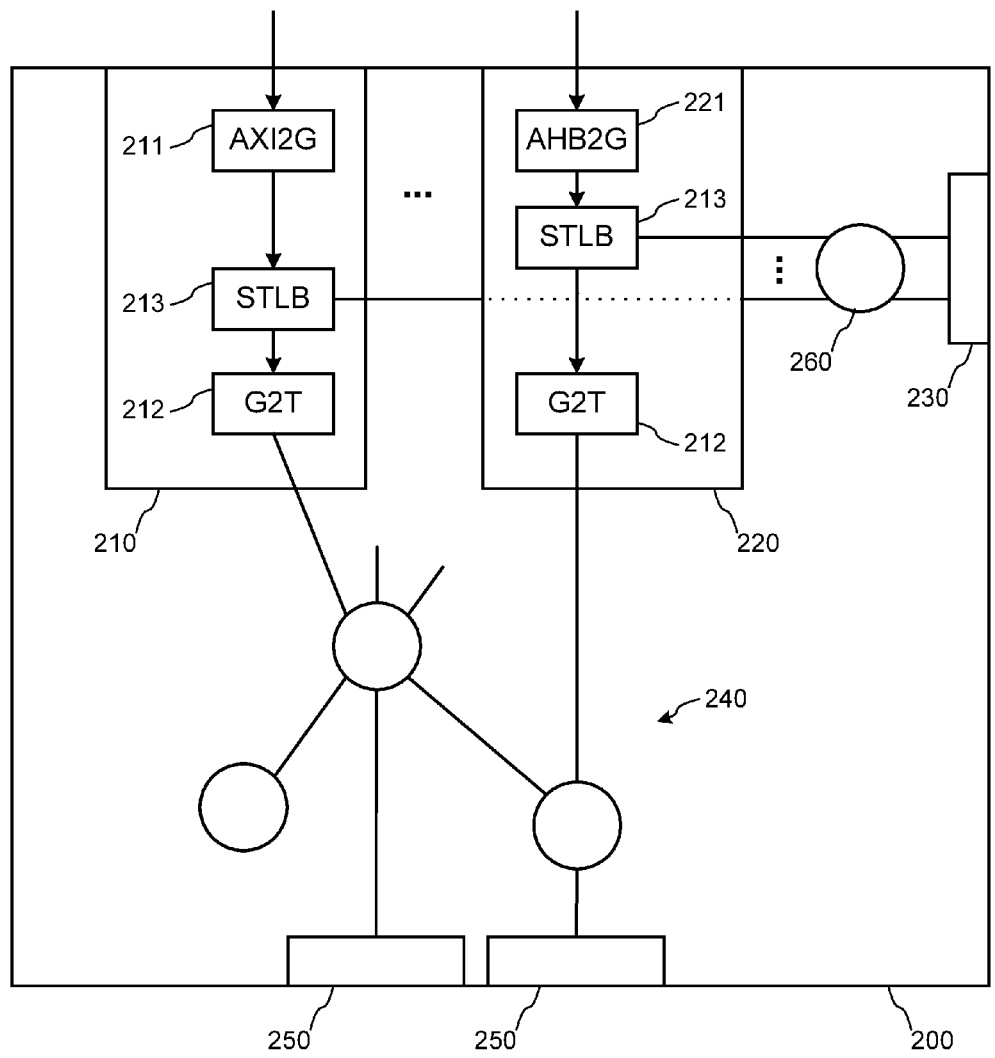
FIG. 2 illustrates an interconnect wherein system TLBs are integrated within initiator network interface units in accordance with the present invention.

FIG. 2 shows an interconnect 200 according to the invention, comprising initiator network interfaces units (network interface unit) 210 and 220. Network interface unit 210 comprises specific-to-generic unit 211 that adapts an initiator AXI transaction interface to an internal generic interface protocol. Network interface unit 220 comprises specific-to-generic unit 221 that adapts an initiator AHB transaction interface to an internal generic interface protocol.

Initiator network interface units 210 and 220 each further comprise a generic to transport unit 212. The generic to transport unit converts each transaction to one or more transport packets and sends the transport packets on datapath transport network 240, which conveys transactions to target network interface unit ports 250.

According to an aspect of the invention, each initiator network interface unit further comprises a STLB 213, arranged between the specific-to-generic unit and the generic to transport unit. The STLBs 213 have a generic protocol interface on its initiator side data request interface and its target side data request interface. Whereas STLBs 112 and 122 are each adapted for their different respective protocols (AXI for STLB 112 and AHB for STLB 122), STLBs 213 are identical, and designed to the generic protocol specification. The complexities of protocol adaptation are performed in specific-to-generic units 211 and 221, and therefore the generic protocol is designed for simplicity. According to some aspects of the invention, the generic protocol does not support the complexities of unaligned accesses or complex ordering requirements. As such, the design of STLB 213 is greatly simplified. Furthermore, because of the simplification, the logic paths in STLB 213 are shorter and its latency is less.

G2T 212 decodes transaction addresses in order to determine which of a set of one or more target interfaces 250 to which the transaction is directed. STLB 213 must also decode the address to look up the translation. According to another aspect of the invention, address decoding, otherwise performed in G2T 212, is, instead, performed in STLB 213. This provides a benefit of reduced transaction latency.

Naturally, each STLB has a walker interface to send walker requests to walker 230. According to another aspect of the invention, the walker interfaces of STLBs 213 are connected to walker 230 through a transport network 260. Transport network 260 uses the same protocol and library of transport units as transport network 240. This reduces the amount of unit level logic design verification required as well as reduces the complexity of building a performance estimation simulation model. The library of transport units includes:

serialization adapters, to allow trade-offs of bandwidth and wires within the chip floor plan;

clock domain adapters, for separate clock trees and frequency scaling;

power adapters to allows power domain management;

observation probes;

security filters; and other typical on-chip-interconnect units. In contrast, interface port 160 to the walker does not use a standard protocol, and therefore necessarily has a different set of interconnect logic.

Figure 3:
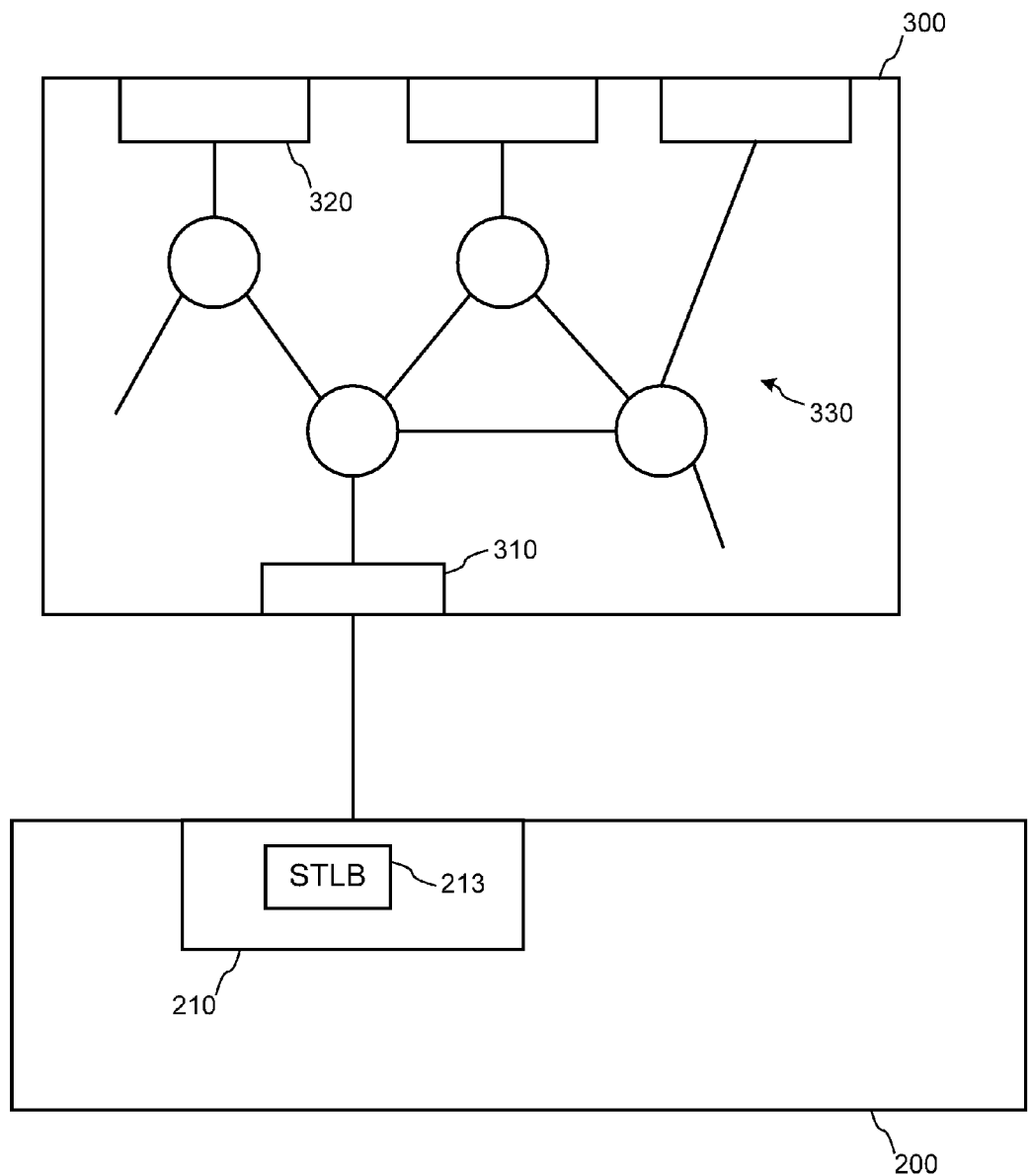
FIG. 3 illustrates a system of two interconnects wherein translation requests of one are supported by system TLBs integrated in the other in accordance with the present invention.

FIG. 3 shows the interconnect 200 of FIG. 2, the initiator network interface unit 210, and the STLB 213 of FIG. 2 in accordance with the teachings of the present invention. A subsystem interconnect 300 is connect through its target network interface unit 310 to the initiator network interface unit 210. The subsystem interconnect 300 comprises a number of initiator ports 320 and an internal network 330.

According to an aspect of the invention, the subsystem interconnect 300 comprises units from the same library as the interconnect 200. According to some aspects of the invention, the interface protocol between the target network interface unit 310 and the initiator network interface unit 210 is a standard protocol. Some standard protocols are AXI, ACE, and OCP. According to other aspects of the invention, the protocol between the target network interface unit 310 and the initiator target interface unit 210 is a special protocol with a particularly low latency such as the network-on-chip socket protocol described in U.S. Non-Provisional patent application 13/626,766 filed on Sep. 25, 2012 and titled: NETWORK ON A CHIP SOCKET PROTOCOL, which is incorporated herein by reference. One feature that makes some protocols low-latency protocols is having a transaction identifier signal that eliminates the need for masters to perform an indirect lookup to associate responses with requests.

According to an aspect of the invention, TLB allocation information is sent by initiators connected to the initiator network interface units 320, transported through the subsystem internal network 330, through the target network interface unit 310 and to the initiator network interface unit 210 where it is provided to the STLB 213. The STLB 213 uses the allocation information to carry out an allocation policy.

According to some aspects of the invention, the TLB allocation information is encoded at the initiator network interface units 320, using ordering ID fields of a transaction protocol. According to other aspects of the invention, TLB allocation information is encoded in protocol side-band signals transported from the initiator network interface units 320 to the target network interface unit 310. According to other aspects of the invention, the TLB allocation information is encoded in network interface unit identifier fields of the transport protocol.

According to some aspects of the invention, STLB prefetch requests are sent from initiator network interface units 320 to STLB 213. Prefetch requests can be of the type described in U.S. Non-Provisional patent application Ser. No. 13/969,425 filed on Aug. 16, 2013 and titled SYSTEM TRANSLATION LOOK-ASIDE BUFFER WITH REQUEST-BASED ALLOCATION AND PREFETCHING, which is incorporated herein by reference. Subsystem interconnect 300 is configured so that prefetch requests are sent or recreated so that the STLB 213 can identify prefetch requests. According to other aspects of the invention, the initiator network interface units 320 use ordering ID bits to differentiate normal from prefetch requests. According to other aspects of the invention, prefetch requests are indicated by sideband signals.

According to an aspect of the invention, initiator network interface units 320 are programmable to differentiate between normal and prefetch requests.

According to an aspect of the invention, TLB allocation information and prefetch identification information can be sent from the initiator network interface units 320 to the target network interface units 310 unaltered such that any number of the subsystem interconnects 300 can be cascaded and still provide allocation information to the STLB 213.

Figure 4:
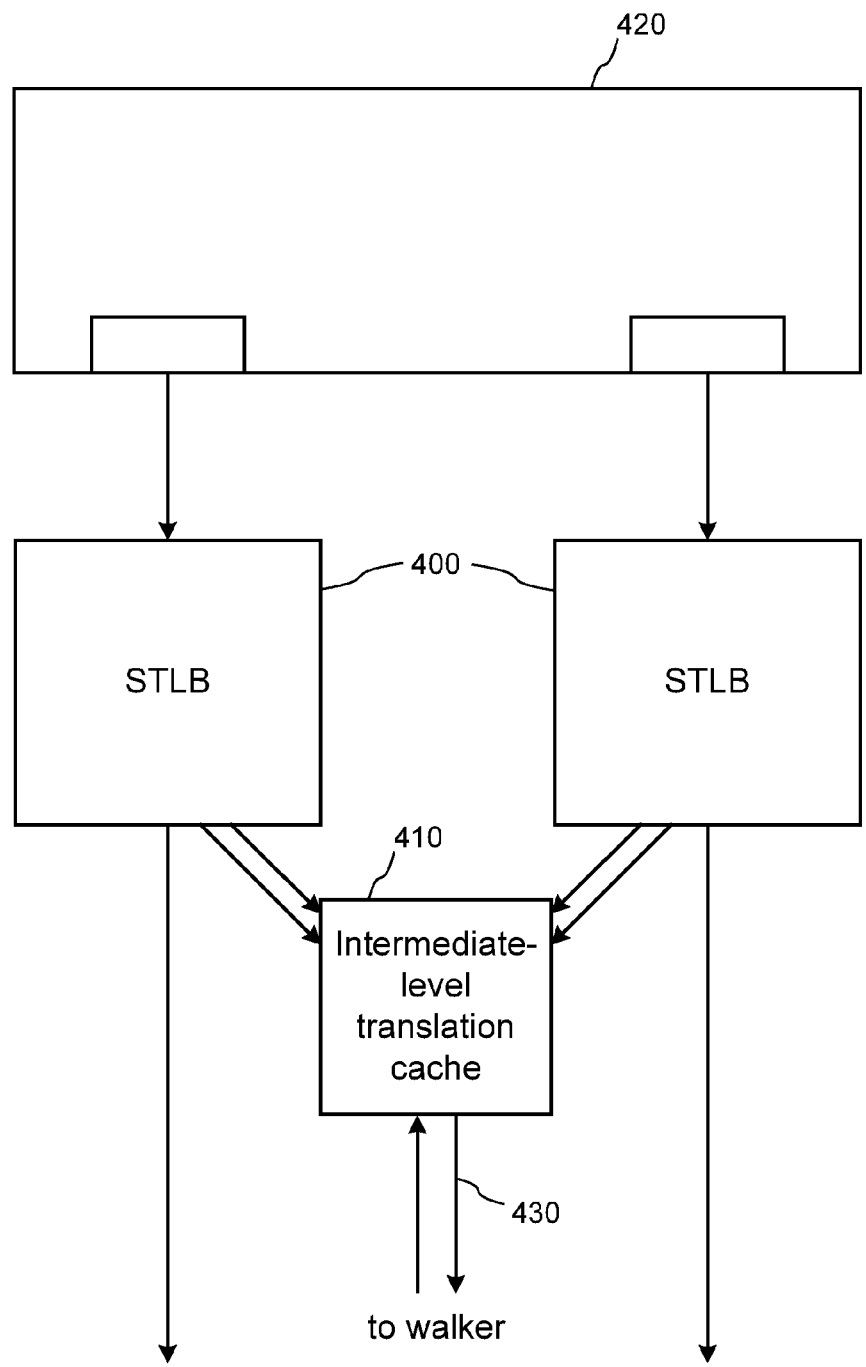
FIG. 4 illustrates system TLBs sharing an intermediate-level translation cache in accordance with the present invention.

As shown in FIG. 4, according to an aspect of the invention, STLBs 400 share intermediate-level translation cache 410. FIG. 4 shows initiator 420 connected to two STLBs 400. The STLBs 400 are each connected to intermediate-level translation cache 410, which is connected to a walker through walker interface 430. Translation requests that miss in both STLB 400 and intermediate-level translation cache 410 are sent to the walker through port 430.

According to an aspect of the invention, intermediate-level translation cache 410 is larger than the cache in STLBs 400, and STLBs 400 share the extra capacity of intermediate-level translation cache 410.

According to an aspect of the invention, requests received by STLBs 400 have cross-locality, i.e. different STLBs 400 need some of the same translations. The intermediate-level cache holds translations as they are returned by the walker, so that the STLB 400 that request second can find its needed translation in intermediate-level cache 410 instead without having to incur the delay of a walker request.

According to an aspect of the invention, initiator 420 is an initiator with multiple interfaces. Initiator 420 distributes traffic between ports. The distribution increases request bandwidth without increasing the width of a link. According to some aspects of the invention, the distribution is decided by interleaving of an address range based on some address bits, so that specific address bits, or a hash of address bits, determine which port is used by a request. According to other aspects of the invention, each port is driven by a cache dedicated to a portion of the address space. According to an aspect of the invention, the multiported initiator is a multimedia engine such as a 3D (GPU) engine, 2D engine, video engine, image processing engine, or signal processing engine.

Traffic coming from multiple ports of the same engine tends to have good page locality, especially if the distribution of requests among ports is done based, at least in parts, on interleaving based on low address bits. In that case, long contiguous bursts will be split amongst the ports, and the STLB latency is significantly reduced by the use of a shared intermediate-level translation cache.

Figure 5:
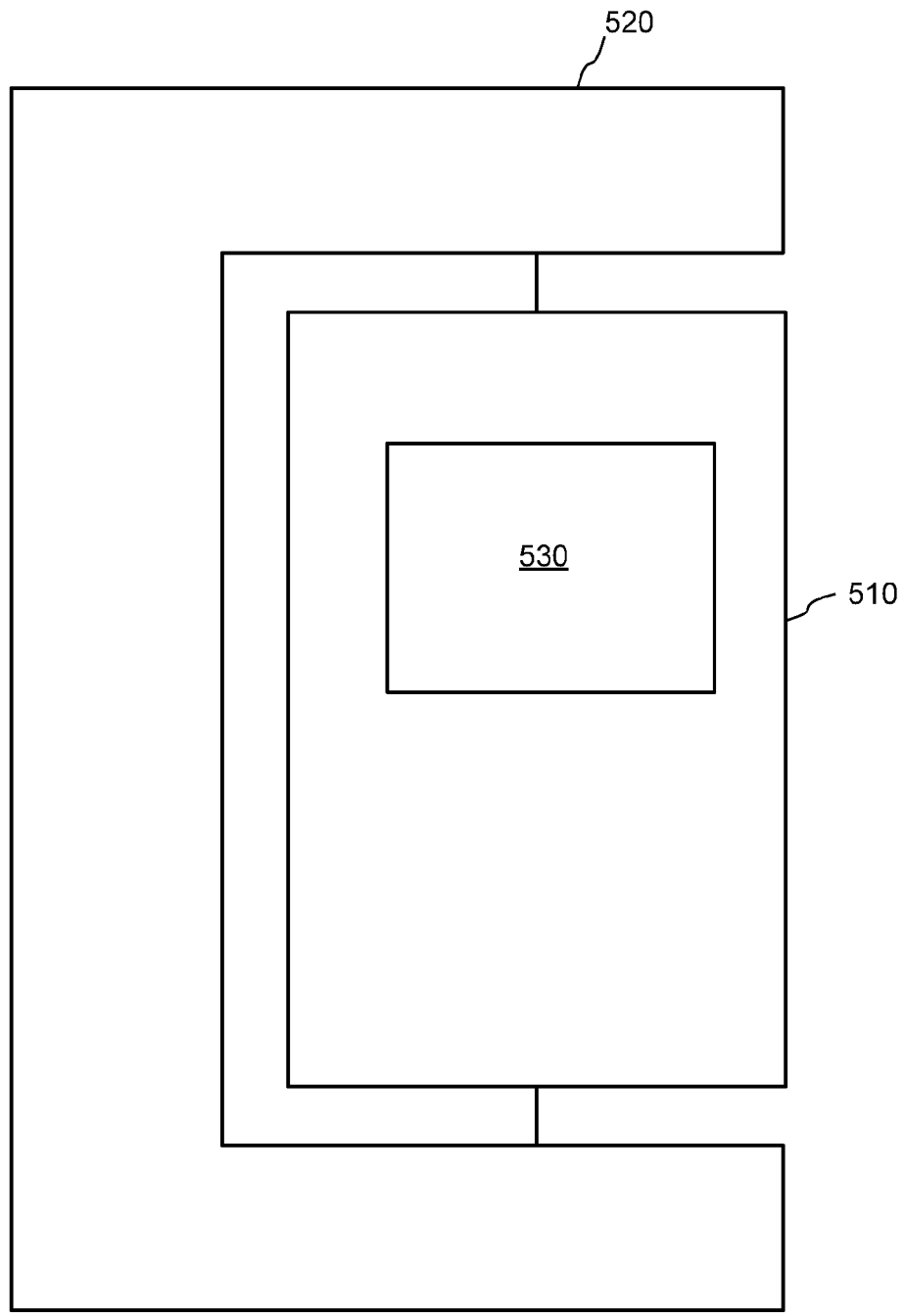
FIG. 5 illustrated a simulation environment for an interconnect in accordance with the present invention.

A simulation environment is presented in FIG. 5 according to the various aspects of the present invention. The simulation environment is implemented with computer executable instructions, run by a computer. Many types of computers could be used, such as a local computer or a cloud computer. The simulation begins by the invocation of the execution of the instructions.

According to an aspect of the invention, interconnect 510 is simulated within simulation environment 520. Interconnect 510 comprises STLB 530. The same simulation environment can be used for an interconnect without an STLB or for an interconnect, such as interconnect 510, comprising a TLB. This avoids great complexity and difficult work required to integrate separate simulation environments for an interconnect and a separate STLB.

According to some aspects of the invention, simulation environment 520 comprises transactors, monitors, various other verification intellectual properties, and a scoreboard. The scoreboard is designed to support an interconnect. The simulation environment, including the scoreboard, can be reused for an interconnect with or without an internal STLB. The simulation environment is implemented in a register transfer level language such as Verilog or System Verilog.

According to other aspects of the invention, the simulation is a performance simulation. The simulation environment is implemented in a system level modeling languages such as SystemC. A common transaction socket modeling protocol is the Open SystemC Initiative (OSCI) Transaction Level Modeling (TLM) 2.0 standard.

As will be apparent to those of skill in the art upon reading this disclosure, each of the aspects described and illustrated herein has discrete components and features which may be readily separated from or combined with the features and aspects to form embodiments, without departing from the scope or spirit of the present invention. Any recited method can be carried out in the order of events recited or in any other order which is logically possible.

Unless defined otherwise, all technical and scientific terms used herein have the same meaning as commonly understood by one of ordinary skill in the art to which this invention belongs. Although any methods and materials similar or equivalent to those described herein can also be used in the practice or testing of the present invention, representative illustrative methods and materials are now described.

All publications and patents cited in this specification are herein incorporated by reference as if each individual publication or patent were specifically and individually indicated to be incorporated by reference and are incorporated herein by reference to disclose and describe the methods and/or system in connection with which the publications are cited. The citation of any publication is for its disclosure prior to the filing date and should not be construed as an admission that the present invention is not entitled to antedate such publication by virtue of prior invention. Further, the dates of publication provided may be different from the actual publication dates which may need to be independently confirmed.

Additionally, it is intended that such equivalents include both currently known equivalents and equivalents developed in the future, i.e., any elements developed that perform the same function, regardless of structure. The scope of the present invention, therefore, is not intended to be limited to the exemplary embodiments shown and described herein.

In accordance with the teaching of the present invention a computer and a computing device are articles of manufacture. Other examples of an article of manufacture include: an electronic component residing on a mother board, a server, a mainframe computer, or other special purpose computer each having one or more processors (e.g., a Central Processing Unit, a Graphical Processing Unit, or a microprocessor) that is configured to execute a computer readable program code (e.g., an algorithm, hardware, firmware, and/or software) to receive data, transmit data, store data, or perform methods.

The article of manufacture (e.g., computer or computing device) includes a non-transitory computer readable medium or storage that includes a series of instructions, such as computer readable program steps or code encoded therein. In certain aspects of the present invention, the non-transitory computer readable medium includes one or more data repositories. Thus, in certain embodiments that are in accordance with any aspect of the present invention, computer readable program code (or code) is encoded in a non-transitory computer readable medium of the computing device. The processor, in turn, executes the computer readable program code to create or amend an existing computer-aided design using a tool. In other aspects of the embodiments, the creation or amendment of the computer-aided design is implemented as a web-based software application in which portions of the data related to the computer-aided design or the tool or the computer readable program code are received or transmitted to a computing device of a host.

An article of manufacture or system, in accordance with various aspects of the present invention, is implemented in a variety of ways: with one or more distinct processors or microprocessors, volatile and/or non-volatile memory and peripherals or peripheral controllers; with an integrated microcontroller, which has a processor, local volatile and non-volatile memory, peripherals and input/output pins; discrete logic which implements a fixed version of the article of manufacture or system; and programmable logic which implements a version of the article of manufacture or system which can be reprogrammed either through a local or remote interface. Such logic could implement either a control system either in logic or via a set of commands executed by a soft-processor.

Accordingly, the preceding merely illustrates the various aspects and principles of the present invention. It will be appreciated that those skilled in the art will be able to devise various arrangements which, although not explicitly described or shown herein, embody the principles of the invention and are included within its spirit and scope. Furthermore, all examples and conditional language recited herein are principally intended to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention as well as specific examples thereof, are intended to encompass both structural and functional equivalents thereof. Additionally, it is intended that such equivalents include both currently known equivalents and equivalents developed in the future, i.e., any elements developed that perform the same function, regardless of structure. The scope of the present invention, therefore, is not intended to be limited to the various aspects discussed and described herein. Rather, the scope and spirit of present invention is embodied by the appended claims.

What is claimed is:

1. An on-chip interconnect comprising:
   a specific-to-generic unit to adapt an initiator Advanced eXtensible Interface (AXI) transaction interface or an initiator Advanced High-performance Bus (AHB) transaction interface to a generic protocol;
   a System Translation Look-Aside Buffer (STLB), the STLB comprising an initiator side data request interface coupled to the specific-to-generic unit to use the generic protocol;
   a walker request transport network comprising at least one instantiation of a unit of a library; and
   a walker interface,
   wherein the STLB is connected to the walker request transport network and the walker request transport network is connected to the walker interface.

2. The on-chip interconnect of claim 1 wherein the unit is a power disconnect unit.

3. The on-chip interconnect of claim 1 wherein the STLB decodes an address to determine a set of targets to which to send a request.

4. The on-chip interconnect of claim 1 wherein the STLB accepts prefetch requests.

5. The on-chip interconnect of claim 4 wherein requests are encoded with an indication of whether they are prefetch requests.

6. The on-chip interconnect of claim 1 wherein the unit is a clock domain adapter.

7. A System-On-A-Chip (SOC) comprising:
   a specific-to-generic unit to adapt an initiator Advanced eXtensible Interface (AXI) transaction interface or an initiator Advanced High-performance Bus (AHB) transaction interface to a generic protocol;
   a System Translation Look-Aside Buffer (STLB), the STLB comprising an initiator side data request interface coupled to the specific-to-generic unit to use the generic protocol;
   a subsystem interconnect; and
   a main interconnect connected to the subsystem interconnect through an interface, the main interconnect comprising the STLB, the STLB configured to perform address translations of requests from the subsystem interconnect.

8. The SOC of claim 7 wherein the interface uses a standard protocol.

9. The SOC of claim 7 wherein the interface uses a low-latency protocol.

10. The SOC of claim 7 further comprising a third interconnect, connected to the subsystem interconnect through a second interface, wherein allocation information is sent from the third interconnect to the main interconnect.

11. The SOC of claim 7 wherein the subsystem interconnect receives requests from an initiator, the requests comprising STLB allocation information, wherein the STLB allocation information is sent from the initiator, through the subsystem interconnect, and is received by the STLB.

12. The SOC of claim 11 wherein the STLB allocation information is encoded in ordering ID fields of a transaction request according to a transaction protocol.

13. The SOC of claim 11 wherein the STLB allocation information is encoded in protocol side-band signals.

14. The SOC of claim 11 wherein the STLB allocation information is encoded in an initiator network interface unit identifier.

15. A System-On-A-Chip (SOC) comprising:
   an initiator comprising a first interface that makes requests according to a first protocol and a second interface that makes requests according to a second protocol;
   a first specific-to-generic unit to adapt the first protocol to a generic protocol;
   a second specific-to-generic unit to adapt the second protocol to the generic protocol;
   an interconnect comprising a first System Translation Look-Aside Buffer (STLB) connected to the first interface, the first STLB comprising an initiator side data request interface coupled to the first specific-to-generic unit to use the generic protocol; and a second STLB connected to the second interface, the second STLB comprising an initiator side data request interface coupled to the second specific-to-generic unit to use the generic protocol; and
   an intermediate-level translation cache for storing translations, the intermediate-level translation cache being connected to the first STLB and the second STLB,
   wherein the first STLB and the second STLB are able to request the same translation from the intermediate-level translation cache.

16. The SOC of claim 15 wherein the intermediate-level translation cache has a larger capacity than a capacity of the first STLB.

17. The SOC of claim 15 wherein the requests made at the first interface and the requests made at the second interface have cross-locality.

18. The SOC of claim 15 wherein the requests made at the first interface and the requests made at the second interface have different addresses.

19. The SOC of claim 15 wherein the initiator comprises:
   a first cache connected to the first interface to cause it to make the requests; and
   a second cache connected to the second interface to cause it to make the requests.

20. The SOC of claim 15 wherein the initiator is a multimedia engine.

21. A method to execute instructions, the instructions represented by an arrangement of a non-transitory computer readable medium, by a computer processor, the instructions causing the computer processor to perform:
   simulating a simulation environment that performs requests and responses according to Advanced eXtensible Interface (AXI) transactions or Advanced High-performance Bus (AHB) transactions;
   translating the requests and responses according to a generic protocol; and
   simulating an interconnect comprising a System Translation Look-Aside Buffer (STLB), the STLB comprising an initiator side data request interface to use the generic protocol,
   wherein the simulation environment is connected directly to the interconnect without performing the requests and responses directly to the STLB.

22. The method of claim 21 wherein the simulation environment is a verification testbench.

23. The method of claim 21 wherein the simulation environment is a performance model.

* * * * *